United States Patent [19]

Houghton et al.

[11] Patent Number: 5,355,029
[45] Date of Patent: Oct. 11, 1994

[54] STAGED CMOS OUTPUT BUFFER

[75] Inventors: Chris L. Houghton, Westborough; Carl F. Windnagle, Hudson, both of Mass.

[73] Assignee: Digital Equipment Corporation, Maynard, Mass.

[21] Appl. No.: 90,359

[22] Filed: Jul. 12, 1993

[51] Int. Cl.$^5$ .......................................... H03K 17/16
[52] U.S. Cl. ..................... 307/443; 307/451; 307/594
[58] Field of Search ............... 307/443, 451, 592, 599, 307/263

[56] References Cited

U.S. PATENT DOCUMENTS

| | | | |
|---|---|---|---|
| 4,593,206 | 6/1986 | Neidorff et al. | 307/270 |
| 4,727,266 | 2/1988 | Fujii | 307/443 |
| 4,857,863 | 8/1989 | Ganger et al. | 330/264 |
| 4,859,870 | 8/1989 | Wong et al. | 307/263 |
| 4,885,485 | 12/1989 | Leake | 307/594 |
| 4,906,867 | 3/1990 | Petty | 307/443 |
| 4,947,113 | 8/1990 | Chism et al. | 324/158 |
| 4,961,010 | 10/1990 | Davis | 307/443 |
| 4,962,345 | 10/1990 | Crafts et al. | 307/270 |
| 4,987,324 | 1/1991 | Wong et al. | 307/451 |
| 5,010,256 | 4/1991 | Dicke | 307/263 |
| 5,013,940 | 5/1991 | Ansel | 307/473 |
| 5,036,232 | 7/1991 | Jungert | 307/443 |
| 5,066,873 | 11/1991 | Chan et al. | 307/443 |
| 5,099,148 | 3/1992 | McClure et al. | 307/443 |
| 5,103,118 | 4/1992 | Peterson | 307/443 |
| 5,111,075 | 5/1992 | Ferry et al. | 307/443 |
| 5,124,579 | 6/1992 | Naghshinem | 307/443 |
| 5,138,194 | 8/1992 | Yoeli | 307/443 |
| 5,153,457 | 10/1992 | Martin et al. | 307/443 |
| 5,157,282 | 10/1992 | Ong et al. | 307/443 |
| 5,157,351 | 10/1992 | Carobolante | 330/277 |
| 5,185,538 | 2/1993 | Kondoh et al. | 307/270 |
| 5,187,686 | 2/1993 | Tran et al. | 365/189.11 |

Primary Examiner—Edward P. Westin
Assistant Examiner—Andrew Sanders
Attorney, Agent, or Firm—James F. Thompson; Ronald C. Hudgens; Albert P. Cefalo

[57] ABSTRACT

A staged CMOS output buffer has multiple output transistors connected in parallel and driven by corresponding predrivers. Each predriver has a first input from which an inactive output transistor can be turned on, and a second input from which the other, active output transistor can be turned off. The input to the output buffer is coupled directly to the second input of both predrivers to turn the output transistors off when switching begins, and a resistor-capacitor (RC) circuit is inserted between the first inputs to stagger the predriver turn-on times to reduce the peak and slope of the switching current. The predriver employs chains of pass transistors to achieve both tri-state functionality and the simultaneous turn-off necessary for the staged configuration. A split termination is also employed to reduce switching current, especially NMOS-PMOS crossover current.

12 Claims, 5 Drawing Sheets

STAGED CMOS OUTPUT BUFFER

FIELD OF THE INVENTION

This invention relates to the field of integrated circuits, and more specifically output buffers associated with integrated circuit output pads.

BACKGROUND OF THE INVENTION

In the field of integrated circuits (ICs), there is a widely-recognized phenomenon that has been responsible for problems appearing in the systems in which the ICs operate. When an output of an IC begins to switch, the instantaneous current through the output buffer in the IC changes very suddenly. This is particularly so for CMOS output buffers, which have very large current transients when they begin to switch. When numerous IC outputs switch simultaneously, the amount of current in the power supply leads of the IC also changes suddenly to meet the demand. This sudden change can cause a significant voltage drop to develop across stray inductance present in the IC's power-distribution network, especially in package leads and bonding wires. If this voltage drop is large enough, it may cause erroneous circuit operation and the loss of stored data. This problem is therefore potentially very severe, and must be addressed in every IC design, particularly those having numerous outputs or driving large external loads. Although it has many names, this problem is herein referred to as "di/dt noise", because of its relationship to the rate of change of current in the output buffer.

There have been many different approaches to reducing di/dt noise. One general approach involves controlling the switching rate, or slew rate, of the output buffers. In this approach, the output buffer is designed so that it cannot turn completely on all at once; rather, it turns on more gradually so that the peak current and its rate of change are reduced.

Within this class of slew-rate controlled output buffers, there is a sub-class of buffers that employ a number of smaller buffers wired in parallel and some means of staggering their switching times. These are referred to herein as "staged buffers" because they turn on in stages. While the final drive current of a staged buffer equals that of the single large buffer it replaces, the transient current is reduced because only one of the smaller buffers is switching at a time.

Before the merits of known staged buffers are discussed, an additional phenomenon must be introduced. One problem that must be addressed in any CMOS buffer, and particularly in a staged buffer, is that of excessive crossover current flowing directly between the pull-up and pull-down transistors in the buffer. Consider a buffer having two pull-up devices in parallel and two pull-down devices in parallel, and some delay element between their gates so that their switching times are staggered. In the interval between the switching of the first and second stages, one transistor from the first stage (for example, the pull-down transistor) will be on at the same time that the opposite transistor in the second stage (in this case, the pull-up transistor) is also on. In such a case, a large crossover current will flow directly through both of those transistors and the power distribution network of the IC, contributing to switching noise. To avoid this problem, staged buffers often have some means for turning off all stages simultaneously, and then turning them on sequentially. By doing this, no stage is driving against another stage when it turns on, and crossover current is kept to a minimum.

One example of a staged buffer can be found in U.S. Pat. No. 5,111,075 issued May 5, 1992 to Ferry et al. and entitled "Reduced Switching Noise Output Buffer Using Diode for Quick Turn-Off". In this scheme, resistors are connected in series between the gates of the staged output transistors. The resistor-capacitor (RC) circuit formed by each resistor and the transistor gate in the following stage provides the necessary incremental turn-on delay. A set of diodes is connected between the buffer input and the gates of the transistors in each stage to turn all stages off simultaneously when the input switches.

Buffers such as that of Ferry rely on the gate capacitance of the output transistors to create the desired RC delay. Typically the output transistors have minimum-length gates to minimize their propagation delay. But as a result, their gate capacitance can vary widely with processing, so that the resulting RC delay is also inconsistent. If the gate were made longer so that its capacitance were more consistent, then the propagation delay of the buffer would increase. Another drawback of relying on output transistor gate capacitance is an undesirable feedback effect: faster transistors generate greater current peaks, so it is desirable to space their switching times; but faster transistors also have lower gate capacitances, so that the RC delay is reduced, bringing their switching times closer together. As a result, switching noise in the faster buffers, which are the most problematic to begin with, is not reduced as much as in slower ones.

Another example of a staged buffer can be found in U.S. Pat. No. 4,961,010 issued Oct. 2, 1990 to Davis, entitled "Output Buffer for Reducing Switching Induced Noise". Like the buffer of Ferry, this buffer uses resistors between the gates of the output transistors to achieve the desired delay. It also uses additional transistors connected to the gates of the output transistors to achieve simultaneous turn-off. The buffer of Davis is also a tri-state buffer; the tri-state circuitry therein is conventional and largely independent of the staging or delay circuitry.

Yet another example of a staged buffer can be found in U.S. Pat. No. 4,987,324 issued Jan. 22, 1991 to Wong et al., entitled "High-Speed CMOS Buffer with Controlled Slew Rate". Wong's buffer employs control inverters preceding each stage. Each control inverter has a different switching threshold, so that the stages switch in a desired sequence to minimize both di/dt and crossover current. The delay between stages is a function of both the inverter switching threshold and the edge rate of the input signal, which in turn are both sensitive to process variations. This scheme also cannot easily be extended to more than two stages if such an extension were to be found desirable.

SUMMARY OF THE INVENTION

In view of the above-described problems and limitations of the prior art, it is an object of the present invention to reduce di/dt noise and crossover current in staged buffers in a manner that is consistent despite normal process variations. It is also an object of the invention to incorporate tri-state functionality into such an improved staged buffer without unduly adding to the required circuit area or complexity.

A buffer in accordance with the present invention has predrivers before the output transistors and an RC delay element between the predrivers. A separate capacitor is connected to the predriver input to achieve the desired capacitance. Because the predrivers are much smaller than the output transistors, a reasonable-size capacitor can be constructed that is nevertheless large enough to be the dominant portion of the total capacitance of the predriver input node. This arrangement reduces the feedback effect described above. Also, this capacitor can be optimized for consistency, so that the capacitive portion of the RC delay is less sensitive to normal processing variations.

In another aspect, the invention also includes a circuit feature for simultaneously turning off all buffer stages that resembles tri-state circuitry, so that both functions can be performed without substantial additional circuit area or complexity.

And in another aspect, the invention includes a split termination arrangement wherein termination resistors are placed in series with both the pull-up and pull-down output transistors. This arrangement reduces both di/dt noise and crossover current, in addition to performing its normal transmission line termination function.

BRIEF DESCRIPTION OF THE DRAWINGS

An embodiment of the invention will be described with reference to the accompanying drawings, in which.

DETAILED DESCRIPTION

Figure 1:
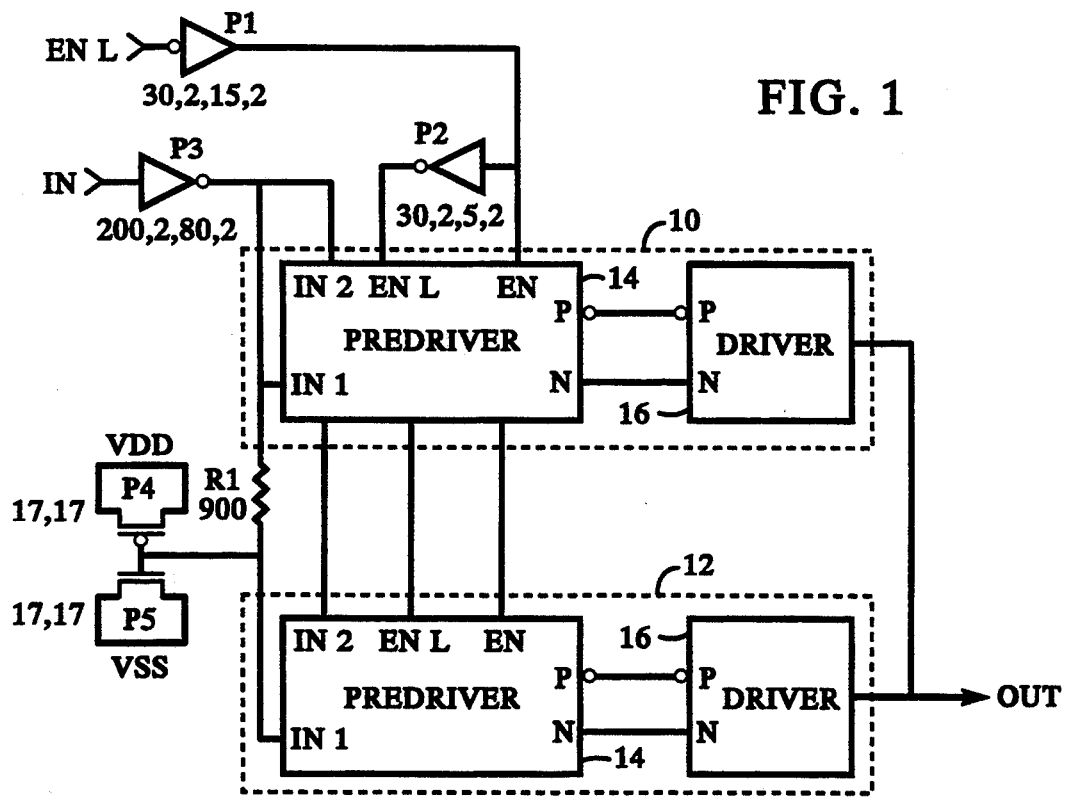
FIG. 1 is an overall schematic diagram of an output buffer in accordance with the principles of the present invention.

FIG. 1 shows an output buffer consisting of a first stage 10 and a second stage 12, each having a predriver 14 followed by a driver 16. The outputs of the stages 10, 12 are connected together to an output node labelled OUT, which is an output pad in a CMOS integrated circuit. The output buffer in the illustrated embodiment is a tri-state output buffer, so that each stage 10, 12 is controlled by an enable signal EN via inverters P1 and P2. An input signal IN is buffered by inverter P3 and fed to both the IN 1 and IN 2 inputs of the first stage 10, to the IN 2 input of the second stage 12, and also to a resistor R1. The resistor R1 is referred to as a "delay resistor" because of its participation in delaying the input to the second stage 12. The other end of the delay resistor R1 is tied to transistors P4 and P5, and also to the IN 1 input of the second stage 12. It will be noted that transistors P4 and P5 are configured in a common fashion as capacitors, with their gates serving as one charge storage node and their source/drains connected together to serve as the other.

The sizes of the inverters and transistors shown in FIG. 1 and elsewhere are indicated in a common fashion by a string of numbers separated by commas, where each number represents a dimension in "CMOS Design Units" or CDUs. The illustrated embodiment was designed with one CDU equal to 0.75 microns; in current CMOS technology, one CDU equals approximately 0.25 microns. In a 2-digit string such as is shown for transistor P4, the first number indicates device width, and the second indicates gate length. Thus the gates of transistors P5 and P6 are square and measure 17 CDUs on a side. In a 4-digit string such as is shown for inverter P1, the first two numbers indicate width and length for the PMOS transistor, and the second two numbers indicate width and length for the NMOS transistor. Thus the PMOS transistor in inverter P1 is 30 CDUs wide and has a gate length of 2 CDUs, and the NMOS transistor is 15 CDUs wide and also has a gate length of 2 CDUs.

The circuit consisting of the delay resistor R1 and transistors P4, P5 is a resistor-capacitor (RC) delay element used to delay the switching of the input IN 1 of the second stage 12 relative to that of the first stage 10. As will be seen below, each stage 10, 12 switches only after its IN 1 input has switched. Thus the RC delay element acts to stagger the switching times of the drivers 16, resulting in the desired reduction in di/dt. It will be noted that the IN 2 input bypasses the RC circuit. This input is responsible for turning off the second stage 12 immediately when the input IN switches to prevent excessive crossover current through the drivers 16.

It is desirable that the capacitive portion of the RC delay circuit have consistent capacitance despite normal processing variations. In the embodiment of FIG. 1, this consistency is achieved by making the gates of transistors P4, P5 square. Because both the width and gate length of the transistors P4, P5 are large relative to process tolerances, their capacitance is more consistent than it would be if they had minimum-length gates. With consistent capacitance provided by the transistors P4 and P5, the predrivers 14 are free to use minimum-gate-length transistors on their inputs so that their propagation delays are minimized. Alternative embodiments may use transistor gates having rectangular or other shapes, with perhaps a concomitant decrease in the consistency of the delay they provide.

Figure 2:
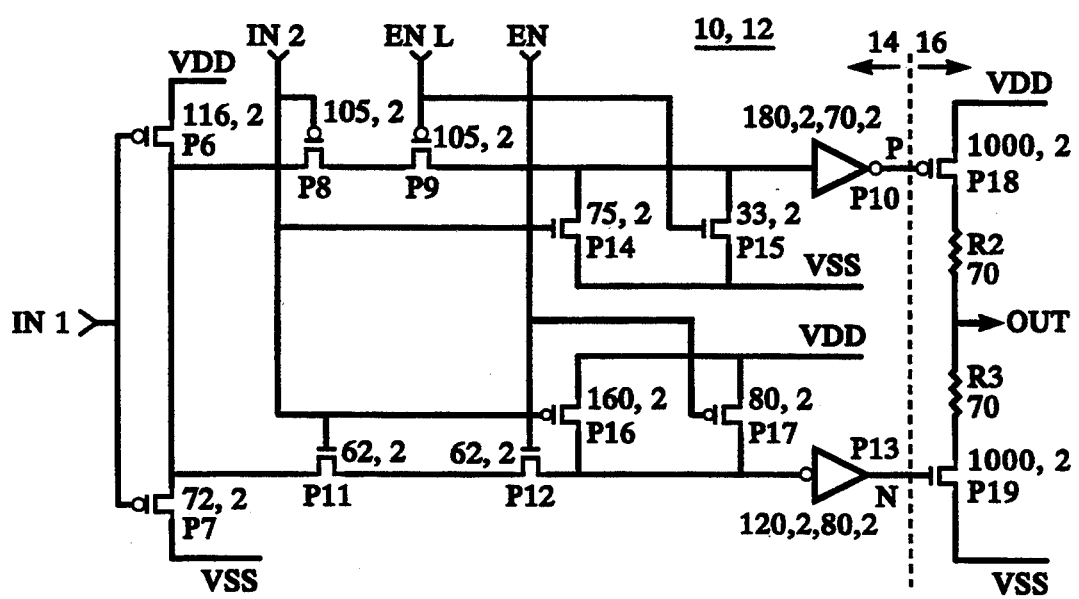
FIG. 2 is a schematic diagram of one stage of the output buffer of FIG. 1.

FIG. 2 shows the details of the predriver 14 and driver 16. In the predriver 14, the input IN 1 is connected to an inverter consisting of pull-up transistor P6 and pull-down transistor P7. This inverter is coupled through a first pass chain consisting of pass transistors P8 and P9 to the input of another inverter P10, and also through a second pass chain consisting of pass transistors P11 and P12 to the input of inverter P13. Pull-down transistors P14 and P15 are also connected to the input of the inverter P10, and pull-up transistors P16 and P17 are connected to the input of the inverter P13. The input IN 2 is connected to the gates of transistors P8, P11, P14, and P16; EN L is connected to the gates of transistors P9 and P15; and EN is connected to the gates of transistors P12 and P17.

The driver 16 has pull-up transistor P18, pull-down transistor P19, and resistors R2 and R3 forming a split termination network whose midpoint is the output node OUT. The P output from the predriver 14 is connected to the gate of transistor P18, and the N output from the predriver 14 is connected to the gate of transistor P19.

Transistors P9, P12, P15, and P17 form a conventional tri-state enabling circuit. They may be omitted in non-tri-state embodiments.

Transistors P8, P11, P14, and P16 allow the input signal itself to turn off the currently-on half of the driver 16 before the other half becomes active to accomplish switching. For example, if an initial state is assumed wherein the signal OUT is HIGH and the signals IN 1 and IN 2 are both LOW, then pull-up transistor P18 is ON. Also, transistors P6, P8, and P9 are also ON, and transistors P14 and P15 are both OFF. When the input signal IN of FIG. 1 switches LOW, signal IN 2 goes high, turning transistor P8 OFF and P14 ON, so that the pull-up transistor P18 in the driver 16 turns OFF. Note that this sequence happens immediately in both stages 10 and 12 of FIG. 1, because the signal IN 2 bypasses the RC circuit.

While the active transistors are being turned off via the IN 2 inputs, signal IN 1 also goes HIGH in the first stage 10. This enables the pull-down transistor P7 and pass transistor P11, and disables the pull-up transistor P16, so that the pull-down transistor P19 in the driver 16 turns ON pulling the signal OUT LOW. The start of this pull-down action in the second stage 12 is delayed by the RC circuit, resulting in the desired staggering of switching current in the drivers 16.

When the input signal IN switches back HIGH, the pull-down transistor P19 is first disabled by pull-up transistor P16, and subsequently transistor P18 is turned on as IN 1 ripples through transistors P6, P8, and P9 and inverter P10. Therefore whenever the input signal switches in either direction, the circuitry shown in FIG. 2 first turns off the active output transistor in each stage before turning them on in the desired sequence.

It is noteworthy that the turn-off circuitry consisting of transistors P5, P11, P14, and P16 mirrors the tri-state circuitry consisting of transistors P9, P12, P15, and P17. The predrivers 10, 12 provide both functions without substantially more complexity or area than either function alone.

It should be pointed out that the use of split termination as shown is particularly advantageous in a staged buffer such as that shown in FIGS. 1 and 2. The resistance in the pull-up and pull-down halves of the driver 10 is twice that of the equivalent single (non-split) series terminator. Therefore the initial current through each driver 10 is less than it would be with a single terminator, so that the effects of di/dt are further diminished.

Figure 3:
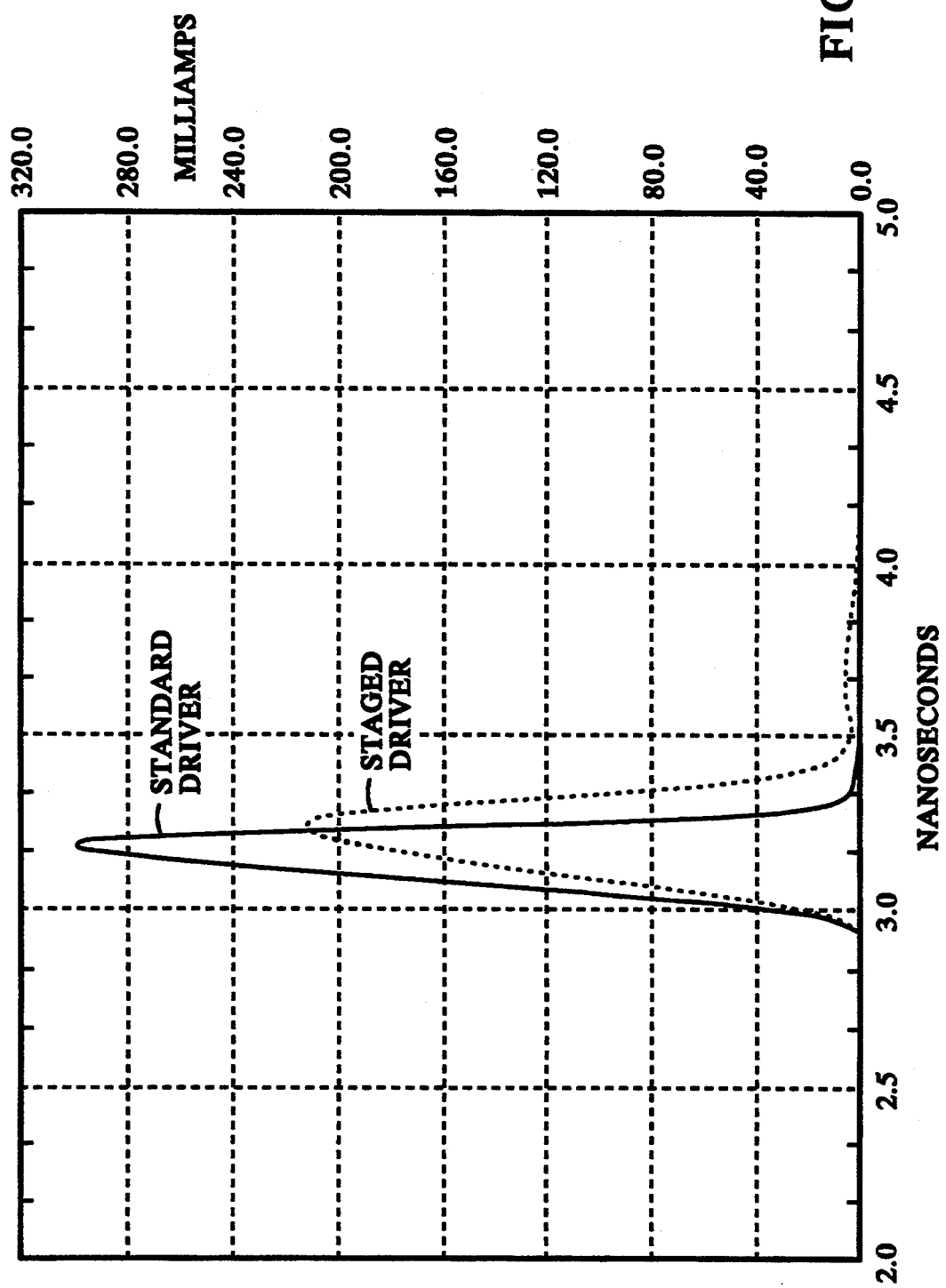
FIG. 3 is a plot of simulated switching current in a driver in the output buffer of FIG. 1.
Figure 4:
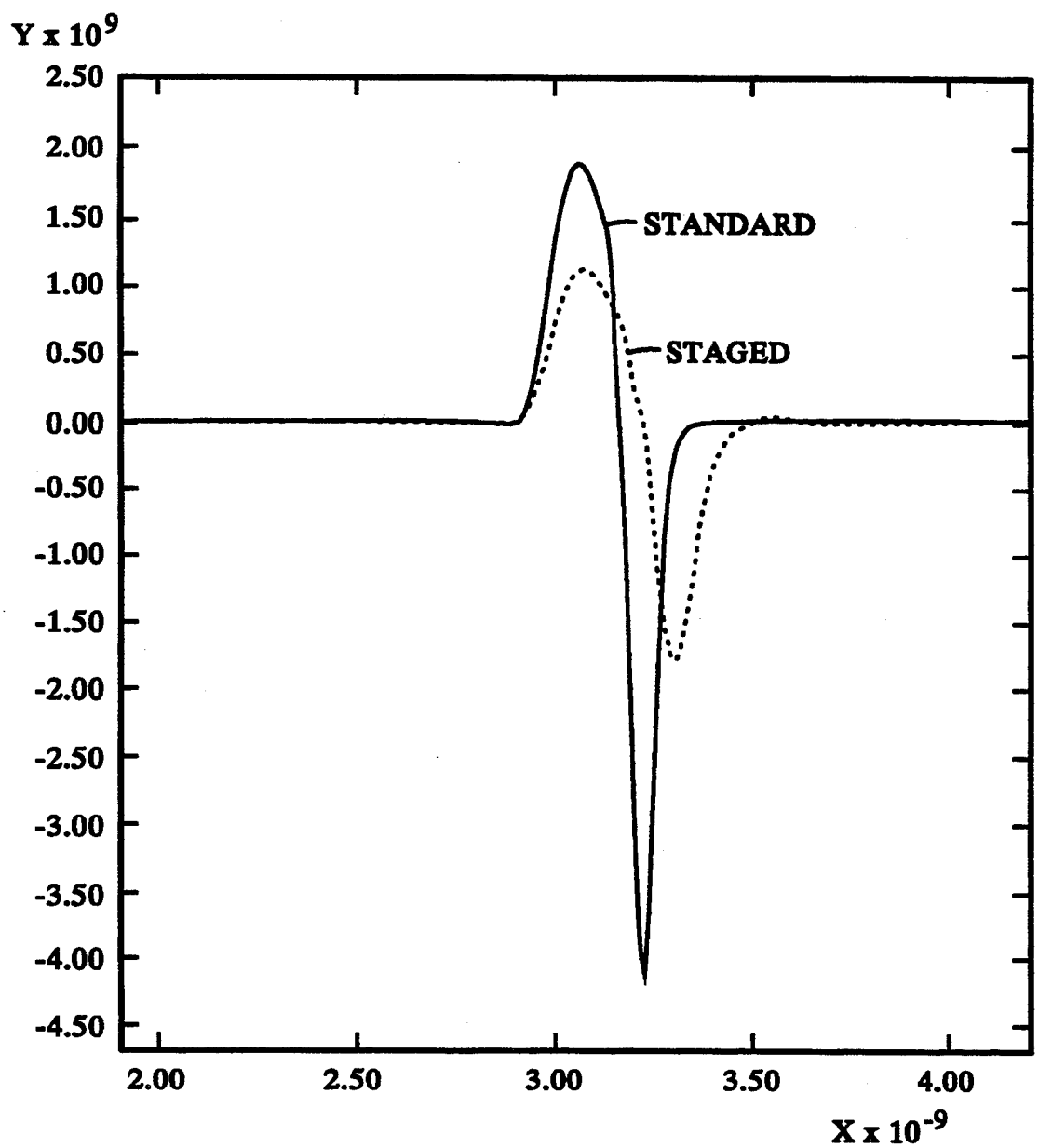
FIG. 4 is a plot of the derivative of the current waveform of FIG. 3.
Figure 5:
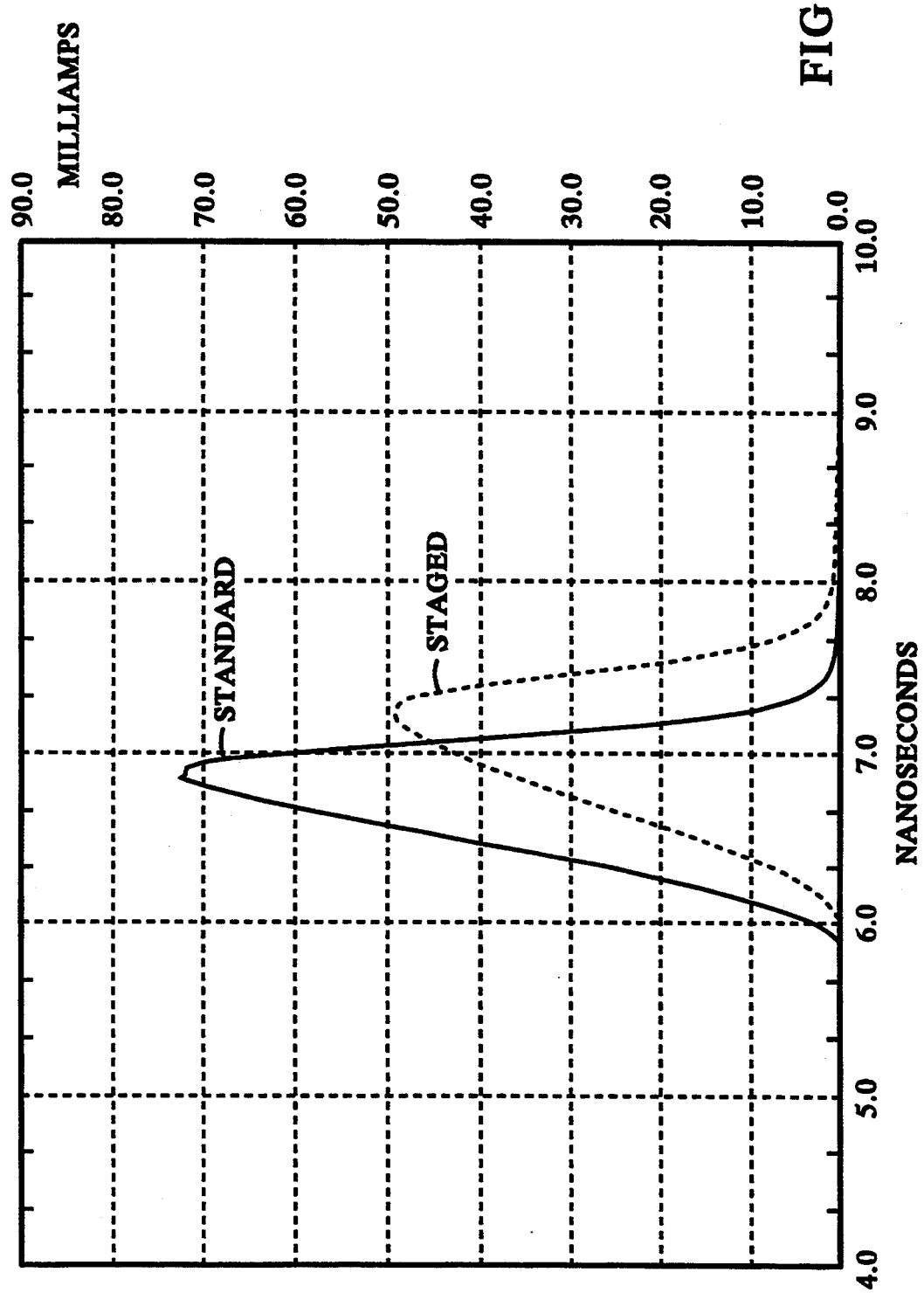
FIG. 5 is another plot of simulated switching current.
Figure 6:
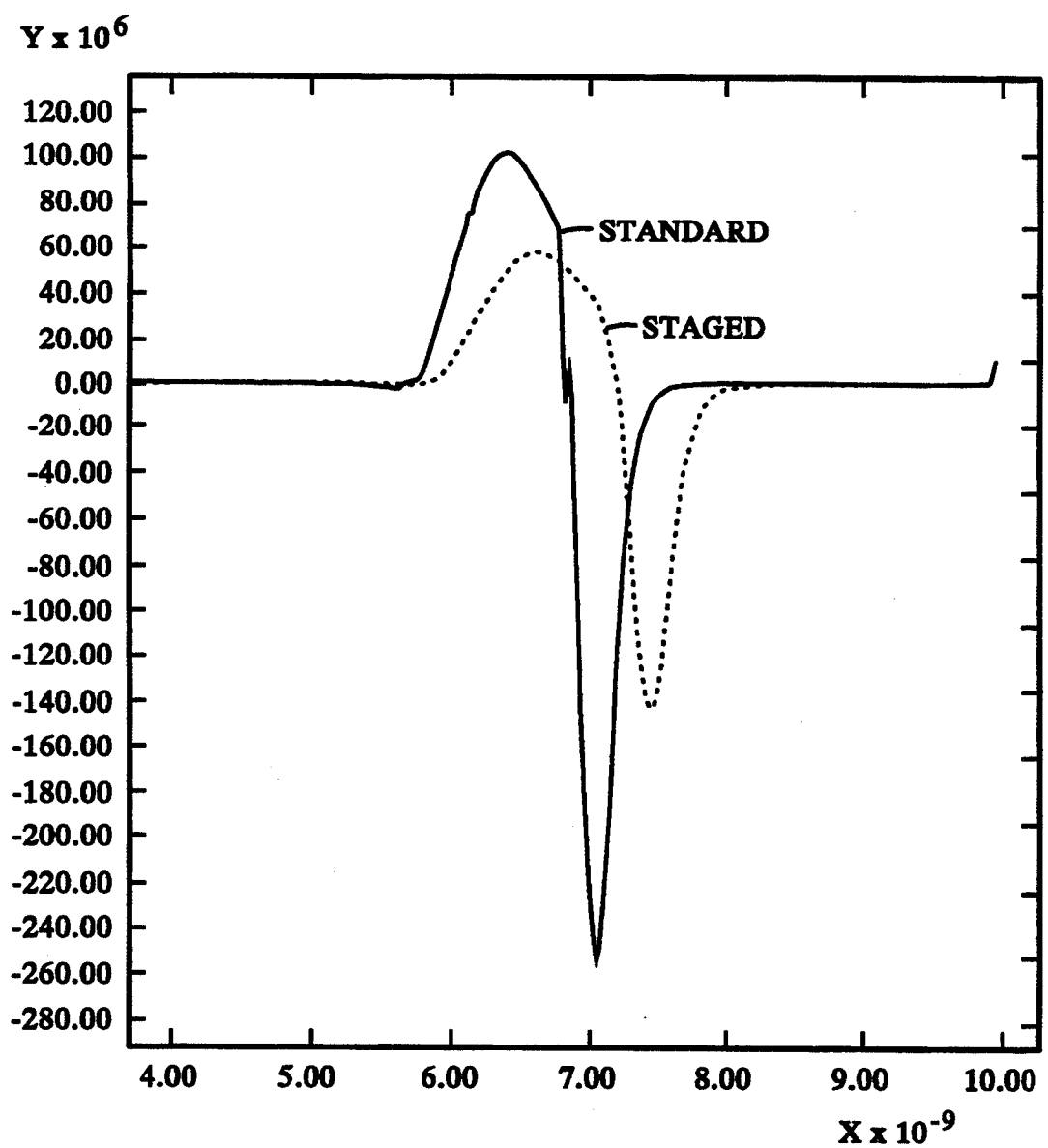
FIG. 6 is a plot of the derivative of the current waveform of FIG. 5.

FIGS. 3 through 6 shows plots of the results of SPICE simulations of the circuit of FIGS. 1 and 2. FIGS. 3 and 4 represent results at the so-called "FF" process corner, where both the N and P transistors have their fastest switching times, while FIGS. 5 and 6 represent results at the "SS" process corner, where both the N and P transistors have their slowest switching times. FIGS. 3 and 5 show a comparison of driver pull-down current for the staged buffer of FIGS. 1 and 2 and a standard non-staged buffer. It will be noted that both the slope and maximum value of the current are smaller for the staged buffer, in accordance with the objects of the invention. FIGS. 4 and 6 show the derivatives of the plots of FIGS. 3 and 5 respectively, clearly showing the marked reduction in di/dt.

While the invention has been described in connection with a specific embodiment, many variations exist that will be apparent to those skilled in the art. In particular and without limitation, the output buffer may employ more than 2 stages to further reduce the peak di/dt and generally smooth out the current profile. Also, it may be advantageous for the stages to have different-size output transistors. All these and other alternative embodiments exist within the scope of the current invention as set forth in the following claims.

What is claimed is:
1. An output buffer, comprising:
a resistor-capacitor (RC) delay circuit having an output and having an input coupled to an input node of said output buffer;
a first driver stage having (i) first and second inputs coupled to said input node, (ii) an output coupled to an output node of said output buffer, (iii) a driver having a pull-up transistor and a pull-down transistor coupled to said output, and (iv) a predriver coupled to said driver having means for turning on an inactive one of said driver transistors from said first input and means for turning off the other one of said driver transistors from said second input; and
a second driver stage having (i) first and second inputs, said first input coupled to said output of said RC delay circuit, and said second input coupled to said input node, (ii) an output coupled to said output node of said output buffer, (iii) a driver having a pull-up transistor and a pull-down transistor coupled to said output, and (iv) a predriver coupled to said driver having means for turning on an inactive one of said driver transistors from said first input and means for turning off the other one of said driver transistors from said second input.

2. An output buffer according to claim 1, wherein said RC delay circuit comprises:
a substantially square PMOS transistor whose gate is connected to the output of said RC delay circuit and whose source/drains are connected to a first reference node; and
a substantially square NMOS transistor whose gate is connected to the output of said RC delay circuit and whose source/drains are connected to a second reference node.

3. An output buffer according to claim 2, wherein said first and second reference nodes are electrically isolated and have different DC voltages.

4. An output buffer according to claim 3, wherein said first reference node is a positive voltage source and said second reference node is ground.

5. An output buffer according to claim 1, wherein said predriver comprises:
high and low enable inputs to respectively receive high and low versions of a tri-state enable signal to be supplied to said output buffer;
a first pass chain having two PMOS pass transistors connected in series between said first input and the gate of said pull-up transistor in said driver and whose gates are respectively coupled to said second input and to said low enable input;
two NMOS pull-down transistors connected to the driver side of said first pass chain and whose gates are respectively coupled to said second input and to said low enable input;
a second pass chain having two NMOS pass transistors connected in series between said first input and the gate of said pull-down transistor in said driver and whose gates are respectively coupled to said second input and to said high enable input; and
two PMOS pull-up transistors connected to the driver side of said second pass chain and whose gates are respectively coupled to said second input and to said high enable input.

6. An output buffer according to claim 5, further comprising:

a first inverter connected between said first input and said pass chains;

a second inverter connected between said first pass chain and the gate of said pull-up transistor in said driver; and a third inverter connected between said second pass chain and the gate of said pull-down transistor in said driver.

7. An output buffer according to claim 1, further comprising:

a number of additional RC delay circuits coupled in series with said RC delay circuit; and the same number of additional driver stages each substantially identical to said first and second stages and having its output coupled to said output node, its first input coupled to the output of a corresponding one of said additional RC delay circuits, and its second input coupled to said input node.

8. An output buffer according to claim 1, wherein said pull-up transistor in said first stage is the same size as said pull-up transistor in said second stage, and wherein said pull-down transistor in said first stage is the same size as said pull-down transistor in said second stage.

9. An output buffer according to claim 1, wherein each of said driver stages further comprises:

a first termination resistor connected between said pull-up transistor and said output node; and a second termination resistor connected between said pull-down transistor and said output node.

10. An output buffer according to claim 9, wherein the resistances of said termination resistors are substantially equal.

11. An output buffer according to claim 1, wherein each of said driver stages further comprises means for tri-stating the output of said driver.

12. An output buffer, comprising:

a delay resistor having one terminal coupled to an input node of said output buffer;

a substantially square PMOS transistor whose gate is connected to the other terminal of said delay resistor and whose source/drains are connected to a positive voltage source;

a substantially square NMOS transistor whose gate is connected to the other terminal of said delay resistor and whose source/drains are connected to ground;

a first driver stage having (i) first and second inputs connected to said one terminal of said delay resistor, (ii) high and low enable inputs to respectively receive high and low versions of a tri-state enable signal to be supplied to said output buffer, (iii) an output connected to an output node of said output buffer, (iv) an output PMOS pull-up transistor, (v) an output NMOS pull-down transistor, (vi) a first termination resistor connected between said output PMOS pull-up transistor and said output, (vii) a second termination resistor having resistance substantially equal to that of said first termination resistor and connected between said output NMOS pull-down transistor and said output, (viii) a first inverter whose input is connected to said first input, (ix) a first pass chain connected at one end to the output of said first inverter and having two PMOS pass transistors connected in series whose gates are respectively connected to said second input and to said low enable input, (x) two NMOS pull-down transistors connected to the other end of said first pass chain and whose gates are respectively connected to said second input and to said low enable input, (xi) a second pass chain connected at one end to the output of said first inverter and having two NMOS pass transistors connected in series whose gates are respectively connected to said second input and to said high enable input, (xii) two PMOS pull-up transistors connected to the other end of said second pass chain and whose gates are respectively connected to said second input and to said high enable input, (xiii) a second inverter connected between the other end of said first pass chain and the gate of said output PMOS pull-up transistor, and (xiv) a third inverter connected between the other end of said second pass chain and the gate of said output NMOS pull-down transistor; and a second driver stage having (i) first and second inputs, said first input connected to the other terminal of said delay resistor, and said second input connected to said one terminal of said delay resistor, (ii) high and low enable inputs to respectively receive said high and low versions of said tri-state enable signal, (iii) an output connected to said output node of said output buffer, (iv) an output PMOS pull-up transistor, (v) an output NMOS pull-down transistor, (vi) a first termination resistor connected between said output PMOS pull-up transistor and said output, (vii) a second termination resistor having resistance substantially equal to that of said first termination resistor and connected between said output NMOS pull-down transistor and said output, (viii) a first inverter whose input is connected to said first input, (ix) a first pass chain connected at one end to the output of said first inverter and having two PMOS pass transistors connected in series whose gates are respectively connected to said second input and to said low enable input, (x) two NMOS pull-down transistors connected to the other end of said first pass chain and whose gates are respectively connected to said second input and to said low enable input, (xi) a second pass chain connected at one end to the output of said first inverter and having two NMOS pass transistors connected in series whose gates are respectively connected to said second input and to said high enable input, (xii) two PMOS pull-up transistors connected to the other end of said second pass chain and whose gates are respectively connected to said second input and to said high enable input, (xiii) a second inverter connected between the other end of said first pass chain and the gate of said output PMOS pull-up transistor, and (xiv) a third inverter connected between the other end of said second pass chain and the gate of said output NMOS pull-down transistor.

* * * * *